United States Patent [19]

Uchida

[11] 4,385,308
[45] May 24, 1983

[54] NON-VOLATILE SEMICONDUCTOR MEMORY DEVICE

[75] Inventor: Yukimasa Uchida, Yokohama, Japan

[73] Assignee: Tokyo Shibaura Denki Kabushiki Kaisha, Kawasaki, Japan

[21] Appl. No.: 151,599

[22] Filed: May 20, 1980

[30] Foreign Application Priority Data

May 24, 1979 [JP] Japan .................................. 54-64182

[51] Int. Cl.³ ...................... H01L 27/02; H01L 29/78; H01L 29/34; H01L 29/04
[52] U.S. Cl. ....................................... 357/41; 357/54; 357/59; 357/23; 365/184
[58] Field of Search .................... 357/23 UT, 41, 59; 365/184

[56] References Cited

U.S. PATENT DOCUMENTS 4,090,257  5/1978  Williams .............................. 365/184
4,112,507  9/1978  White et al. .................... 357/23 VT
4,122,544 10/1978  McElroy ........................ 357/23 VT

OTHER PUBLICATIONS

Yatsuda et al., "N-channel Si-gate MNOS Device for High Speed EAROM", Proc. 10th Conf. Solid State Devices, Tokyo, (1978); Japanese J. Applied Physics, vol. 18, (1979), Suppl. 18-1, pp. 21-26.

Dill et al., "A New MNOS Charge Storage Effect", Solid-State Electronics, vol. 12, (1969), pp. 981-987.

Tickle et al., "Electrically Alterable Non-Volatile Memory Technology", 1972 Wescon Technical Papers, Session 4, 4/2, pp. 1-8.

Primary Examiner—Gene M. Munson
Attorney, Agent, or Firm—Finnegan, Henderson, Farabow, Garrett & Dunner

[57] ABSTRACT

A silicon nitride layer and a memory gate electrode are successively formed over a portion of a principal surface of a semiconductor substrate between drain and source regions formed therein and adjacent to the drain region via a thin silicon dioxide layer. A portion of the substrate principal surface, to which the source region is contiguous, is covered by a thick silicon dioxide layer, and a selection gate electrode is buried in the thick silicon dioxide layer. This two-input gate transistor construction constitutes a memory cell.

3 Claims, 15 Drawing Figures

NON-VOLATILE SEMICONDUCTOR MEMORY DEVICE

BACKGROUND OF THE INVENTION

This invention relates to non-volatile semiconductor memory devices and, more particularly, to a non-volatile semiconductor memory device such as electrically alterable read only memory (EAROM).

Hitherto, a commonly termed non-volatile semiconductor memory device which comprises a variable threshold value field-effect device using a gate insulation film having a charge storage function is well known in the art. There are available a metal-nitride-oxide-semiconductor (MNOS) device, a metal-alumina-oxide-semiconductor (MAOS) device and a dual-dielectric-charge-storage (DDC) device, and among these devices the MNOS device is extensively used in practice. For example, in an EAROM which uses these memory devices, memory storage characteristics, operating characteristics, bit density, etc. are important in performance.

The prior-art MNOS-EAROM products use P-channel MNOS devices. Usually, in the MNOS structure, those in which the flat band voltage is on the negative side can be more readily produced than those in which the flat band voltage is on the positive side, and in this respect the P-channel enhancement type MNOS device is advantageous compared to the N-channel enhancement type MNOS device for the former can be more readily manufactured than the latter. In an EAROM memory cell array using P-channel MNOS devices, each memory cell can thus be constructed without using a transistor for selection but merely by using a single MNOS device.

However, it is a fact that to date the memory cell using a P-channel MNOS device is too slow in operation to be able to sufficiently meet the recent demand for the high speed operation of the EAROM. While the N-channel MNOS devices are superior in the operation speed, they usually tend to be of the depletion type, and it is difficult to produce the enhancement type devices. With the depletion type, the threshold voltage is, for instance, +5 volts at the time of a high level state, −5 volts at the time of a low level state, and a prior-art memory cell array structure only one half the window of the threshold value, for instance, values between 0 and 5 volts, can be utilized. With the prior-art memory cell array structure a read-out voltage has to be impressed upon the gate of the MNOS device at the time of reading out information while it is well known that with the memory device of this type the impression of a gate bias voltage extremely deteriorates the memory storage characteristic. Therefore, limitations are imposed upon the number of times of the information read-out, and it is necessary to add a complicated refresh construction.

Figure 1:
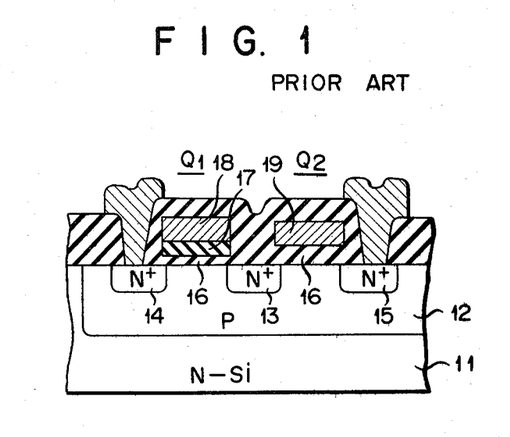
FIG. 1 is a sectional view showing an example of the prior-art memory cell construction used for the EAROM.

In order to solve the above problems, it has been proposed to provide an MOS selection transistor in series with an MNOS device within each memory cell, that is, to provide a two-transistor construction for each memory cell. Such a memory cell is disclosed, for instance, in "N-channel Si-gate MNOS Device for High Speed EAROM" announced by Yuji Yatsuda et al in the Digest of Technical Papers issued during the 10th Conference on Solid State Devices held in Tokyo on Aug. 29 through 30, 1978. FIG. 1 shows the construction of this memory cell. It has an N-channel MNOS device $Q_1$ and an MOS selection transistor $Q_2$, which are formed between a common $N^+$-type region and respective $N^+$-type regions formed in a P-type well 12 which is in turn formed in an N-type silicon substrate 11. The MNOS device $Q_1$ has a structure including a silicon dioxide layer 16, a silicon nitride layer 17 and a polycrystal silicon layer constituting a memory gate electrode 18, these layers being formed in the mentioned order on the P-type well 12. The MOS selection transistor $Q_2$ has a structure which is obtained by successively forming the silicon dioxide layer 16 and polycrystal silicon layer constituting a selection gate electrode 19.

With the construction of FIG. 1, however, it is inevitable that the area of the memory cell is large compared to the structure where a single transistor is formed for each cell, and thus it is impossible to increase the bit density. In addition, with this construction the breakdown voltage between the gate region 18 and source and drain regions 13 and 14 of the MNOS device $Q_1$ and that between the regions 13 and 14 and the silicon substrate 11 are low. Particularly, dielectric breakdown of these portions is prone when erasing and writing information is repeated. As a solution to this problem it may be thought to make the source and drain regions of the MNOS device to have a high breakdown voltage structure. However, the high breakdown voltage structure usually increases the memory cell area, so that with the prior-art structure of FIG. 1 where both the source and drains 13 and 14 of the MNOS device $Q_1$ it is inevitable that the memory cell area is extremely large.

SUMMARY OF THE INVENTION

An object of the invention is to provide a non-volatile semiconductor memory device which has superior memory storage characteristics and reliability and has a high bit density.

Another object of the invention is to provide a non-volatile semiconductor memory device which has a two-input gate structure with a memory gate electrode and a selection gate electrode provided within a single memory cell element.

According to the invention, there is obtained a non-volatile semiconductor memory device, which comprises first and second regions of the opposite conductivity type to the substrate, the first and second regions being formed in and contiguous to one principal surface of the semiconductor substrate and spaced apart a predetermined distance from each other, a first gate insulating film having charge storage function formed on the principal surface in correspondence with the first region; a memory gate electrode provided in accordance with the first gate insulating film; a second gate insulating film having no charge storage function formed on the principal surface in correspondence with the second region; and a selection gate electrode provided in correspondence with the second gate insulating film.

DESCRIPTION OF THE PREFERRED EMBODIMENTS

Figure 2:
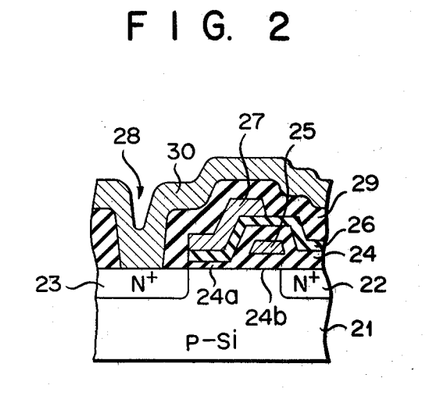
FIG. 2 is a sectional view showing a two-input gate type memory cell structure embodying the invention.

Referring now to FIG. 2, two N+-type regions 22 and 23 are formed at a predetermined interval in a P-type silicon substrate 21 contiguous to one principal surface thereof, and they are used as a source region and a drain region respectively. A portion of the principal surface of the substrate 21 extending from the termination of the boundary between the drain region 23 and the rest of the substrate 21 and covering the source region 22 is covered with a silicon oxide film 24. This film 24 has a thin film portion 24a and a thick film portion 24b. The thin film portion 24a is formed adjacent to the drain region 23, and the thick film portion 24b is formed adjacent to the source region 22. A selection gate electrode 25 consisting of an impurity-doped polycrystal silicon layer is buried in the thick film portion 24b. One end of the selection gate electrode 25 overlaps the source region 22 via the oxide film 24.

The silicon oxide film 24 is entirely covered by a gate insulating film having a charge storage function, i.e., a silicon nitride film 26. A memory gate electrode 27 consisting of an impurity-doped polycrystal silicon layer is formed on the silicon nitride film 26 over a portion thereof corresponding to the thin film portion 24a of the silicon oxide film. The memory gate electrode 27 need to correspond at least to the thin film portion 24a. In this embodiment, however, it also partly corresponds to the thick film portion 24b and thus to the selection gate electrode 25. The memory gate electrode 27 and the portion of the silicon nitride film 26 not covered by the memory gate electrode 27 are covered by an insulating layer of silicon oxide layer 29 except for a contact hole 28 formed on the drain region 23. The insulating layer 29 and the surface of the drain region 23 on which the contact hole 28 is defined are covered by a metal film, for instance an aluminum film 30.

The edges of the thin silicon oxide film portion 24a, nitride film 26 and memory gate electrode 27 are substantially aligned to the corresponding edge of the drain region 23.

Figure 3:
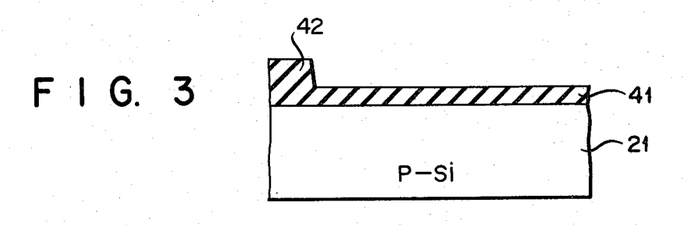
FIGS. 3 to 11 are views illustrating the respective steps of an example of the method of manufacturing the memory cell shown in FIG. 2.
Figure 4:
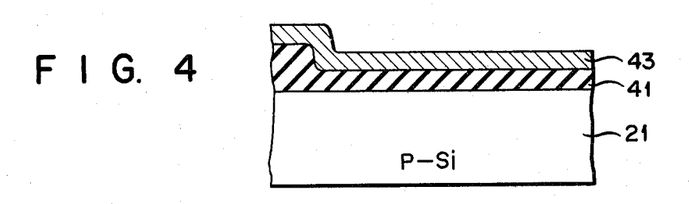
Figure 5:
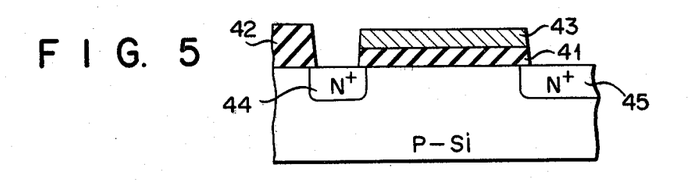

An example of the process of manufacturing the device of the emodiment of FIG. 2 will now be described with reference to FIGS. 3 to 11. In FIG. 3, a silicon dioxide layer 41 is formed to a thickness of about 800 angstroms on a P-type silicon substrate 21. A left end portion of the layer 41 has an increased thickness to serve as a field oxide layer 42. Then, as shown in FIG. 4, a polycrystal silicon layer 43 doped with, for instance, an N-type impurity at a concentration of about $10^{20}/cm^3$ is formed on the oxide layer 41 and 42. Subsequently, as shown in FIG. 5, the polycrystal silicon layer 43 and oxide silicon layer 41 are etched to leave the illustrated portions, and these remaining layers 41 and 43 are utilized as a mask for diffusing an N+-type impurity into the substrate 21 to form two N+-type regions 44 and 45, which are of the opposite conductivity type to the substrate 21 and to serve respectively as drain and source.

Figure 6:
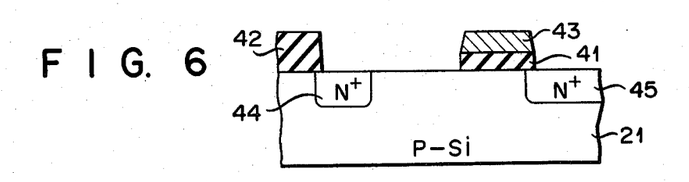
Figure 7:
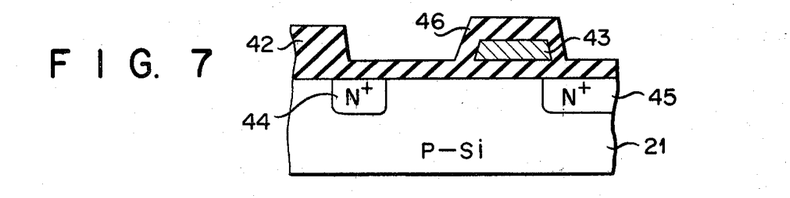
Figure 8:
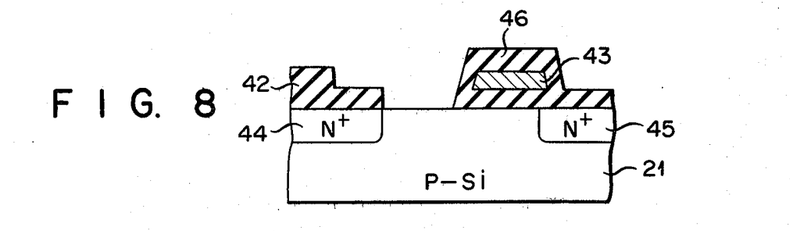

Then, portions of the polycrystal silicon layer 43 and oxide silicon layer 41 adjacent to the N+-type region 44 are etched away as shown in FIG. 6. The remaining polycrystal silicon layer 43 is used as the selection gate electrode. In this state, the entire principal surface of the P-type silicon substrate 21 is covered with a silicon dioxide layer 46 to a thickness of several 1,000 angstroms as shown in FIG. 7. Of the silicon oxide layer 46, a portion other than that portion overlying the N+-type region 44 and portion in which the burried selection gate electrode 43 is located is removed, for instance by the dry etching method, to expose the principal surface of the substrate 21 as shown in FIG. 8. At this time, the thickness of the silicon dioxide layer 46 over the selection gate electrode 43 is set to, for instance, about 1,000 angstroms.

Figure 9:
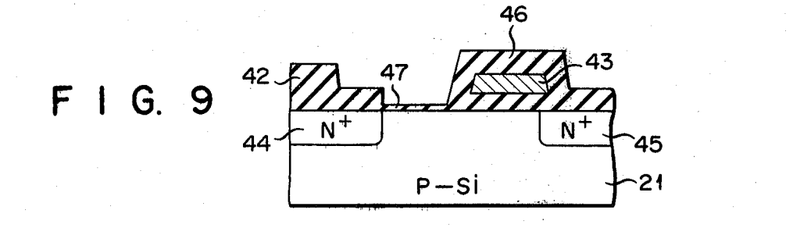
Figure 10:
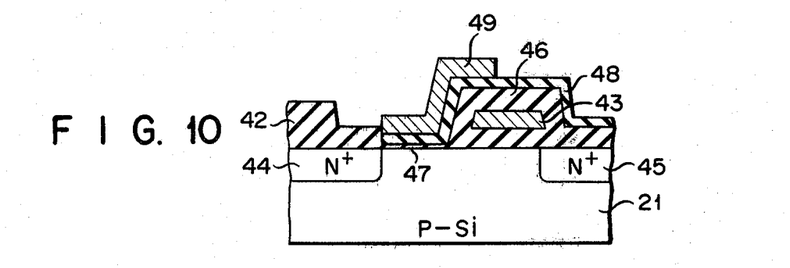

Then, as shown in FIG. 9, the exposed principal surface of the substrate 21 is covered again with silicon dioxide layer 47. This silicon dioxide layer 47 is very thin, for instance of the order of 20 angstroms. Then, as shown in FIG. 10, a silicon nitride layer 48 having a charge storage function is formed to cover the portions of the silicon dioxide layers 47 and 46 on the right hand side of the termination of the boundary between the N+-type region 44 and the rest of the substrate 21. Thereafter, a polycrystal silicon layer 49 doped with an N-type impurity at a concentration of about $10^{20}/cm^3$ is formed on the silicon nitride layer 48. This polycrystal silicon layer 49 is used as the memory gate electrode. At this time, the polycrystal silicon layer 49 is formed such that an end portion of it overlaps a portion of the polycrystal silicon layer 43 via the silicon dioxide layer 46 and silicon nitride layer 48.

Figure 11:
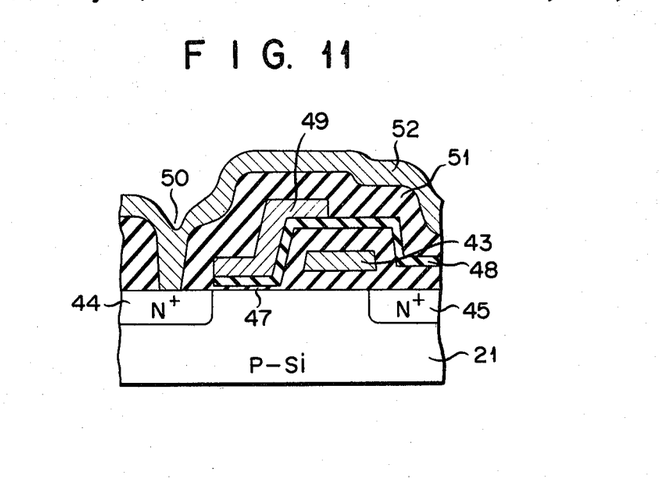

Then, principal surface side of the wafer is entirely covered with a thick silicon dioxide layer 51. Thereafter, a portion of the silicon dioxide layer formed on the N+-type drain region 44 is etched away as shown in FIG. 11 and the surface of the region 44 corresponding to a contact hole 50 is exposed. Afterwards, a metal layer, for instance an aluminum layer 51, is formed on the silicon dioxide layer 51 such that it is partly contiguous to the N+-type drain region 44 over the portion thereof corresponding to the contact hole 50. In this way, a non-volatile semiconductor memory device of the two-input gate transistor construction of FIG. 2 embodying the invention is obtained.

With the two-input gate memory transistor construction as shown in FIG. 2 according to the invention, only the silicon dioxide layer 24b is formed and no silicon nitride layer is formed between the selection gate electrode 25 and silicon substrate 21. Thus, the device is free from particularly the disadvantage of the BT (bias temperature) variation, i.e., variation of the threshold voltage with a change of the ambient temperature at the time of the presence of the bias voltage. In contrast, a construction in which not only the silicon dioxide layer but also a silicon nitride layer is formed between the gate electrode 25 and silicon substrate 21, is subject to the BT variation, and this deteriorates its characteristics as the memory cell.

While the above embodiment is illustrated as a memory cell unit, it is possible to construct an EAROM by arranging a plurality of such memory cells in a matrix form.

Figure 12:
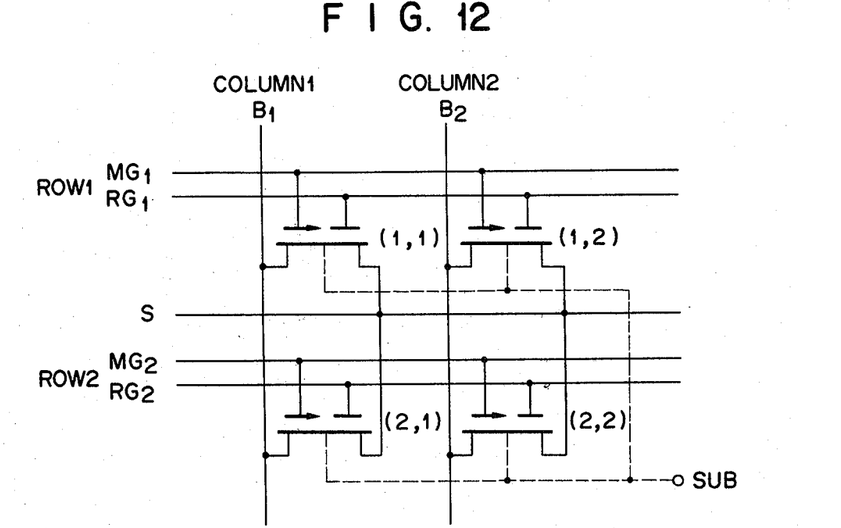
FIG. 12 is a circuit diagram showing an equivalent circuit to the EAROM shown in FIGS. 13 and 14.
Figure 13:
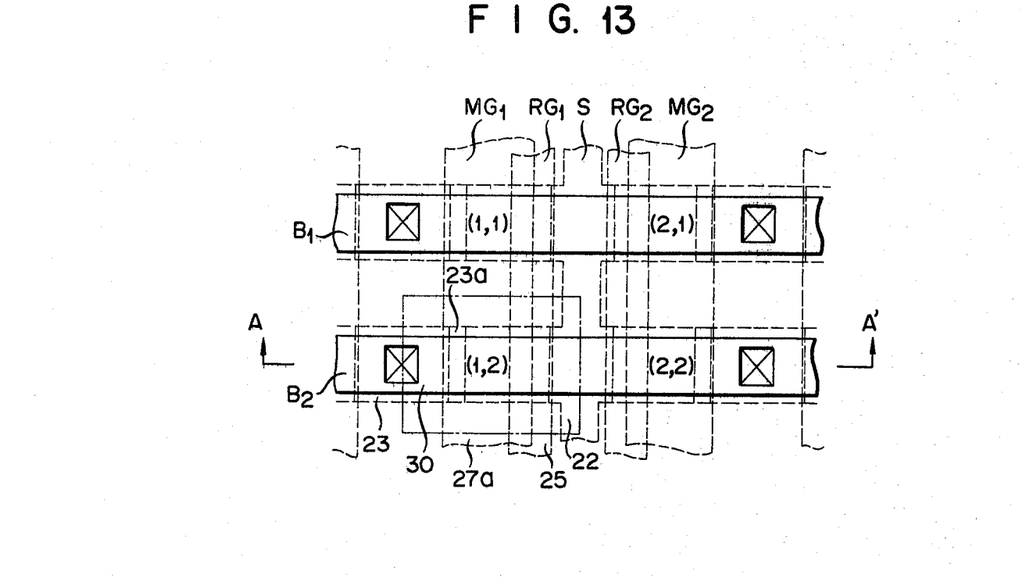
FIG. 13 is a plan view showing a pattern of the memory cell array of a portion corresponding to FIG. 14.
Figure 14:
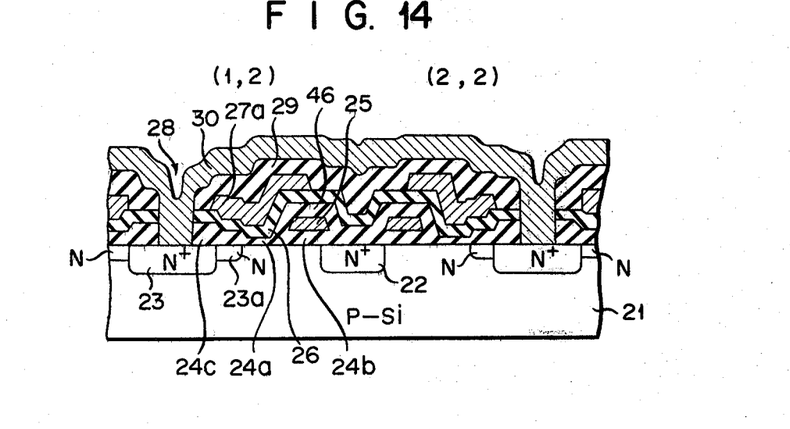
FIG. 14 is a sectional view taken along line A—A and viewed in the direction of arrow in FIG. 13, showing another embodiment of the invention applied to a memory cell array.

FIGS. 12 to 15 show another embodiment of the invention applied to such EAROM. FIG. 12 is a circuit diagram showing an equivalent circuit of this embodiment, which may be an N-channel EAROM, FIG. 13 is a schematic plan pattern, and FIG. 14 is a section taken along line A—A' in FIG. 14. Here, a 4-bit portion, namely 2 rows by 2 columns, is shown. In FIG. 12, a memory cell in the i-th row and in the j-th column is indicated as (i, j). Here, i and j are respectively i=1 or 2 and j=1 or 2. As is apparent from FIG. 12, each memory cell has a two-input gate transistor construction as shown in FIG. 2. The memory gate electrode and selection gate electrode here are connected as electrodes to respective signal lines MGi and RGi (i=1 or 2) common to each row, the drain is connected to a bit signal line Bj (j=1 or 2 here) common to each column, and the source is connected to a source signal line which is common to the matrix. The substrate is common to the matrix and is controlled by a signal line SUB as shown by broken lines in FIG. 12.

In FIG. 13, one bit of the memory cell is enclosed within a broken line rectangle, and the construction of this portion will be described with reference to FIG. 14, which a section taken along line A—A' in FIG. 13. An N+-type layer 22 constituting a source region, an N+-type layer 23 constituting a drain region and an N-type layer 23a are provided in a common P-type silicon substrate. It is assumed that the substrate 21 is formed on, for instance, an N-type silicon substrate or an insulating substrate such as sapphire or spinel. A selection gate electrode 25 consisting of an impurity-doped polycrystal silicon is provided over a portion of the substrate 21 between the source and drain regions 22 and 23, more particularly on the side of the source region 22, such that it partly overlaps the source region 22 via a gate insulating film consisting of a silicon oxide film 24b about 800 angstroms in thickness. The surface of the selection gate electrode 25 is oxidized to cover it with a silicon oxide film 46 about 1,000 angstroms in thickness. Over a portion of the substrate 21 between the source and drain regions 22 and 23, more particularly on the side of the drain region 23, a memory gate electrode 27a consisting of an impurity-doped polycrystal silicon is provided such that it partly overlaps the drain region 23 and 23a via a gate insulating film of a two-layer structure consisting of a very thin silicon oxide film 24a about 20 angstroms in thickness and a silicon nitride film 26 grown thereon and about 400 angstroms in thickness.

The gate insulating film 24a and 26 of the aforementioned two-layer structure has charge trap centers provided in the silicon nitride film 26 for effecting transfer of charge between the substrate 21 and charge trap centers, and thus it has a charge storage function. In other words, it is possible to vary the threshold voltage on the memory gate electrode 27a according to voltage applied between the memory gate electrode 27a and substrate 21 and drain region 23 and 23a. For example, when a positive voltage (for instance 20 V) is applied to the substrate 21 with respect to the memory gate electrode 27a, the threshold voltage is shifted in the negative direction to −5 V. Conversely, when a positive voltage is applied to the memory gate electrode 27a with respect to the substrate 21, the threshold voltage is shifted in the positive direction to +5 V.

A portion of the memory gate electrode 27a on the side opposite the drain region 23 and 23a overlaps the selection gate electrode 25 via the silicon oxide film 46 and silicon nitride film 26.

The memory gate electrode 27a is covered by a silicon oxide film 29 about 7,000 angstroms in thickness, which is in turn covered by a metal lead layer 30. The N+-type layer 23 which constitutes the drain region is connected to the metal lead layer 30.

The drain region consists of the N+-type layer 23 and N-type layer 23a, and this is done so for the purpose of improving the surface breakdown voltage between the drain region of the memory cell and the rest of the substrate 21, the voltage being controlled by the memory gate electrode 27a. Further, a silicon oxide film 24c over the N-type layer 23a of the drain region is thicker than the very thin silicon oxide film 24a, i.e., as thick as about 500 angstroms, thus permitting the improvement of the breakdown voltage between the memory gate electrode 27a and drain region 23 and 23a as well as the improvement of the aforementioned surface breakdown voltage. The surface impurity concentration of the N+-type layer 23 is set to, for instance, $10^{20}/cm^3$, and that of the N-type layer 23a to, for instance, $10^{18}/cm^3$.

While the construction of a single memory cell is described above, the arrangement of memory cells will now be described. As is seen from the plan pattern of FIG. 13, the source and drain regions of the memory cell are arranged in the direction of the column. Also, the arrangement of the source and drain regions is conversed between adjacent memory cells in the direction of the column, for instance between the cells (1, 1) and (2, 1) and between the cells (1, 2) and (2, 2), and the source and drain regions are commonly used by adjacent cells. The N+-type layer 22, which constitutes the source region, extends continuously in the direction of the row and serves as source signal line S. The selection gate electrode 25 and memory gate electrode 27a also provide as common electrodes consisting of the respective polycrystal silicon films extending continuously in the direction of the row, and serve as respective signal lines RGi and MGi. The metal lead line 20 commonly connects the drain regions in each column and serves as bit signal line Bj ($B_1$, $B_2$).

Figure 15:
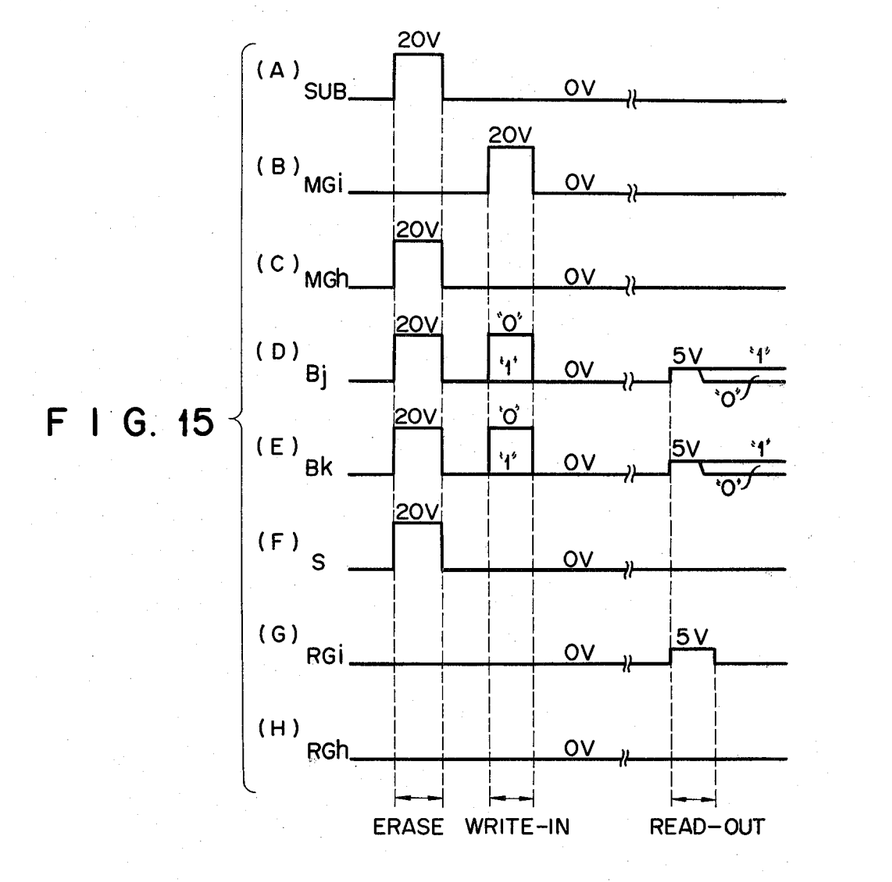
FIG. 15 is a timing chart for illustrating the operation of the device shown in FIGS. 12 to 14.

The operation of the EAROM of the above construction will now be described with reference to FIG. 15. The threshold voltage on the selection gate voltage in each memory cell is fixed at +1 V. For erasing the memory cells in the i-th row, the signal line SUB is held at +20 V, the memory gate electrode signal line MGi for the i-th line at 0 V, the memory gate electrode signal lines MGh (h≠1) for the other rows at +20 V all the bit signal lines Bj and Bk (k≠1) at +20 V, and all the selection gate electrode signal lines RGi and RGh (h≠1) at 0 V. By so doing, only one row can be selectively erased. At this time, a voltage of 20 V is applied between the memory gate electrode and substrate as mentioned earlier only in the memory cells in the i-th row, and the threshold voltage on the memory gate electrode is shifted in the negative direction to −5 V. This −5 V level state of the threshold voltage is defined as, for instance, information "0".

For writing in the memory cells in the i-th row, +20 V is applied to the signal line MGi only, and the signal lines MGh for the other lines, substrate signal line SUB, source signal line S and selection gate electrode signal lines RGi and RGh are all held at 0 V. Assuming that the positive state of the threshold voltage on the memory gate electrode is defined as "1", for writing "1" in the memory cell (i, j) the bit signal line Bj rendered to be at 0 V. Since at this time all the selection gate electrode signal lines RGi and RGh are at 0 V, no channel is formed under the selection gate electrode in any memory cell. Also, since the bit signal line Bj is at 0 V, an electric field is applied across the gate insulating film under the memory gate electrode in the memory cell (i, j). Thus, the threshold voltage on the memory gate electrode in the memory cell (i, j) is shifted in the positive direction to +5 V, so that "1" is written.

For inhibiting the writing of "1" in the memory cell (i, j) in the j-th column and holding the cell in a "0" state during this writing operation, the bit signal line Bj is held at +20 V. By so doing, electrons on the semiconductor surface beneath the memory gate electrode are absorbed into the drain region, thus causing the depletion of the semiconductor surface or formation of an inversion layer contiguous to the drain region. Consequently, no high voltage is applied between the semiconductor surface (at a potential of about 20 V) and the memory gate electrode, and the threshold voltage is thus held unchanged. If the erasing has been done before the writing, the previous information "0" is held unchanged at this time.

The writing of "1" and the inhibition of the writing can also be effected in the same way in the memory cells in the other columns.

For the reading operation, a source voltage of 5 V is applied to all the bit signal lines Bj and Bk through a load device. Also, the substrate signal line SUB, all memory gate electrode signal lines MGi and MGh and source signal line S are held at 0 V. In this way, the selection gate electrode signal line RGi for the desired i-th row is held at 5 V, and the other selection gate electrode signal lines RGh are held at 0 V. In consequence, the potential on the bit line Bj is reduced to 0 V through discharge when the information in the memory cell (i, j) is "0", while it remains at 5 V without discharge when the information is "1".

In the above manner, it is possible to obtain the selective erasing of a desired row in the memory cell array, selective writing in a desired bit and selective reading out from a desired bit.

According to this embodiment, in comparison to the prior-art memory cell shown in FIG. 1 in which an MNOS element and an MOS transistor for selection, these being independent of each other, are connected in series, the memory cell area is reduced with the memory cell having a two-input gate MOS transistor structure where the diffusion layer 13 connecting both the elements $Q_1$ and $Q_2$ in FIG. 1 is omitted. Thus, it is possible to obtain an EAROM at a high bit density. In addition, the memory cell arrangement in which the individual memory cells have their source and drain regions arranged in the direction of the column such that the arrangement of the source and drain regions are arranged between adjacent memory cells and are commonly used by adjacent memory cells in the column, contributes to the bit density increase.

Further, with this embodiment, there is no need for applying a voltage to the memory gate electrode at the time of the reading operation. Furthermore, only the drain region is the terminal region that faces the memory gate electrode, and the source region does not face the memory gate electrode. Thus, the memory storage characteristic is superior and the reliability is high.

Moreover, in this embodiment, for realizing a high breakdown voltage construction of memory cell it is necessary to introduce a high breakdown voltage structure only into the side of the drain region 23 and 23a as shown in FIG. 14, so that this can be realized with less increase of the memory cell area.

While the preceding embodiments of the invention have concerned with N-channel devices, the invention can of course be similarly applicable to P-channel devices. Further, while the MNOS constructions have been described in the preceding embodiments, the invention can also be applied to a device which makes use of an other non-volatile semiconductor memory element structure using a gate insulating film having a charge storage function.

As has been described in the foregoing, according to the invention it is possible to realize an EAROM, which has excellent memory storage characteristics and reliability and which permits realization of a high bit density by introducing a two-input gate MOS transistor construction into the memory cell and taking a particular memory cell arrangement into considerations.

What is claimed is:

1. A non-volatile semiconductor memory device comprising:
   (a) a plurality of memory cells arranged in a matrix having rows and columns, each of said memory cells including:
   (i) a semiconductor substrate of a first conductivity type,
   (ii) drain and source regions of a second conductivity type opposite to said first conductivity type, said drain and source regions being formed in and contiguous to a principal surface of said semiconductor substrate such that said source and drain regions are separated in said semiconductor substrate a predetermined distance, said source regions being constituted by impurity injection layers extending continuously in the direction of said rows of said matrix and said source and drain regions capable of being used by adjacent memory cells in the direction of said columns of said matrix,
   (iii) a first gate insulating film having no charge storage function and being formed on said principal surface with a thick portion and a thin portion, said thick portion covering said source region and said thin portion extending from said thick portion to the boundary of said substrate and said drain region which is closest to said source region,
   (iv) a selection gate electrode buried within said first gate insulating film, said selection gate electrode including a first impurity-doped polycrystal layer extending continuously in the direction of said rows of said matrix,
   (v) a second gate insulating film having a charge storage function and formed on said first gate insulating film, and
   (vi) a memory gate electrode formed on said second gate insulating film having a first end portion overlapping a portion of said selection gate electrode via said second gate insulating film and said thick portion of said first gate insulating film and a second end portion overlapping said thin film portions, said memory gate electrode including a second impurity-doped polycrystal layer extending continuously in the direction of said rows of said matrix;
   (b) first means for commonly connecting said selection gate electrodes and said memory gate electrodes of said individual memory cells in each of said rows;
   (c) a metal lead line commonly connecting said drain regions of said memory cells in each of said columns; and (d) second means for commonly connecting said source regions of all of said memory cells in said matrix.

2. The memory device according to claim 1, wherein said semiconductor substrate is a silicon substrate, said first and second gate insulating films are respectively a silicon oxide film and a silicon nitride film, and said selection gate electrode and memory gate electrode are respectively impurity-doped polycrystal silicon layers.

3. The memory device according to claim 1, wherein said selection gate electrode partially overlaps said source region in the direction of the thickness of said semiconductor substrate.

* * * * *